United States Patent
Huang

(10) Patent No.: US 8,536,900 B2
(45) Date of Patent: Sep. 17, 2013

(54) CIRCUIT AND METHOD FOR DETECTING MULTIPLE SUPPLY VOLTAGES

(75) Inventor: Lei Huang, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/458,574

(22) Filed: Apr. 27, 2012

(65) Prior Publication Data

US 2013/0027089 A1  Jan. 31, 2013

(30) Foreign Application Priority Data

Apr. 29, 2011 (CN) .......................... 2011 1 0111780

(51) Int. Cl.
  *H03K 5/22* (2006.01)
(52) U.S. Cl.
  USPC .................. 327/87; 327/143; 327/89; 327/77
(58) Field of Classification Search
  USPC ................ 327/87, 77, 78, 88, 89, 54, 56, 58, 327/62, 143, 198, 590, 594, 595
  See application file for complete search history.

(56) References Cited

U.S. PATENT DOCUMENTS

| | | | |
|---|---|---|---|
| 6,456,170 B1 * | 9/2002 | Segawa et al. | 331/143 |
| 7,382,167 B1 * | 6/2008 | Umminger et al. | 327/76 |
| 7,679,415 B2 * | 3/2010 | Chi | 327/291 |
| 8,089,305 B2 * | 1/2012 | Matano | 327/142 |
| 8,415,993 B1 * | 4/2013 | Newman et al. | 327/142 |
| 2008/0100266 A1 * | 5/2008 | Sobue | 320/134 |

* cited by examiner

*Primary Examiner* — Lincoln Donovan
*Assistant Examiner* — Jung H. Kim
(74) *Attorney, Agent, or Firm* — Schwegman Lundberg & Woessner P.A.

(57) ABSTRACT

An apparatus comprises a supply voltage divider, a state machine, two comparators and a threshold selector. The supply voltage divider divides a $V_{CC}$ into N states $S_K$, and acquires the border voltages $V_K$ and $V_{K+1}$ corresponding to the $S_K$ through a resistor divider. The threshold selector acquires a corresponding voltage $V_K$ from the supply voltage divider according to the current state $S_K$ outputted by the state machine and then sends the acquired $V_K$ as $V_H$ to a first comparator, and acquires a corresponding voltage $V_{K+1}$ and sends the acquired $V_{K+1}$ as $V_L$ to a second comparator. The state machine determines whether or not the $V_H$ and the $V_L$ are matched with the current state $S_K$. If matched, the OSC of the state machine will be turned off, otherwise, the next state $S_{k+1}$ or $S_{k-1}$ of the $S_K$ will be outputted.

16 Claims, 4 Drawing Sheets

US 8,536,900 B2

CIRCUIT AND METHOD FOR DETECTING MULTIPLE SUPPLY VOLTAGES

RELATED APPLICATION

The present application claims the benefit of priority to Chinese Patent Application Ser. No. 201110111780.3, filed on Apr. 29, 2011, which is hereby incorporated by reference herein in its entirety.

BACKGROUND OF THE INVENTION

The power supply voltage of an electronic system often undergoes a decrease in voltage, especially when being powered by a battery. The voltage of a battery will drop in a curve form when the power of the battery is insufficient, and too low of a voltage possibly leads to an abnormal operation of the system. Thus, an electronic system is usually provided with a circuit for detecting supply voltage to avoid the voltage too low.

FIG. 1 is a schematic diagram of a circuit for detecting supply voltages according to the related art, and as shown in FIG. 1, the circuit for detecting supply voltage consists of a reference voltage circuit 101, a resistor divider circuit 102, a Schmitt trigger comparator 103 and a latch 104, wherein a VDD is divided by resistors R1 and R2 to obtain a voltage VIN, the obtained voltage VIN is connected with the positive input terminal of the Schmitt Trigger comparator 103, and the negative input terminal of the Schmitt Trigger comparator 103 is connected with a reference voltage VREF. The working principle of the circuit lies in that the Schmitt Trigger comparator 103 outputs a high level when the VIN is lower than the VREF, and then the voltage of the output node MRK is at a high level, and on the other side, the Schmitt Trigger comparator 103 outputs a low level when the VIN is higher than the VREF, and then the voltage of the output node MRK is at a low level. Through the voltage division of the resistors $R_1$ and $R_2$, the change of the VDD causes a linear change in the voltage value of the VIN, but the reference voltage is not changed following the change of the VDD, thus realizing a voltage detection function according to the level change of the output node MRK.

It can be seen that, according to the approach of in FIG. 1, a plurality of comparators should be used to detect multiple voltage ranges of a single supply voltage. For instance, if detecting four power supply voltages, four comparators are required.

Due to the power consumption of each comparator, in a circuit for detecting multiple supply voltages, the power consumption of the whole circuit will be undoubtedly huge if multiple comparators are used to detect multiple supply voltages. Power consumption is a very important performance index in a circuit system, and this performance index should be considered by all developers and designers.

Overview

An object of the present invention is to provide a solution for detecting multiple supply voltages to at least solve the problem that power consumption of the existing circuit in the related art for detecting multiple supply voltages is huge.

An example of a circuit to achieve the purpose above includes a supply voltage divider, a state machine, two comparators and a threshold selector.

The supply voltage divider, connected with the threshold divider, is configured to divide a supply voltage $V_{CC}$ into N states $S_K$, and to acquire the border voltages $V_K$ and $V_{K+1}$ corresponding to the $S_K$ through a resistor divider, wherein K=1, 2, . . . N. The threshold selector, connected with the supply voltage divider and the state machine, is configured to acquire a corresponding voltage $V_K$ from the supply voltage divider according to the current state $S_K$ outputted by the state machine, and then send the acquired $V_K$ as $V_H$ to a first comparator in the two comparators, and to acquire a corresponding voltage $V_{K+1}$ and send the acquired $V_{K+1}$ as $V_L$ to a second comparator in the two comparators, wherein the $V_H$ is greater than the $V_L$. The first comparator is configured to compare a reference voltage $V_{ref}$ from a reference voltage circuit with the $V_H$ in magnitude, the second comparator is configured to compare the $V_{ref}$ with the $V_L$ in magnitude. The state machine is configured to determine whether or not the $V_H$ and the $V_L$ outputted by the threshold selector are matched with the current state $S_K$, when each clock period of an oscillator (OSC) arrives, according to the output results of the first comparator and the second comparator, wherein if the $V_H$ and the $V_L$ are matched with the current state $S_K$, the OSC of the state machine will be turned off, and otherwise, the OSC will be turned on to provide the clock of the state machine to output the next state $S_{K+1}$ or $S_{K-1}$ of the $S_K$.

By the present invention, multiple supply voltages can be detected using two comparators, which solves the problem that power consumption of existing circuit for detecting multiple supply voltages is huge in the related art, reduces the number of comparators and improves the performance of the system.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

The drawings illustrated here provide a further understanding of the present invention and form a part of the present application. The exemplary embodiments and the description thereof are used to explain the present invention without unduly limiting the scope of the present invention. In the drawings.

DETAILED DESCRIPTION

Figure 1:
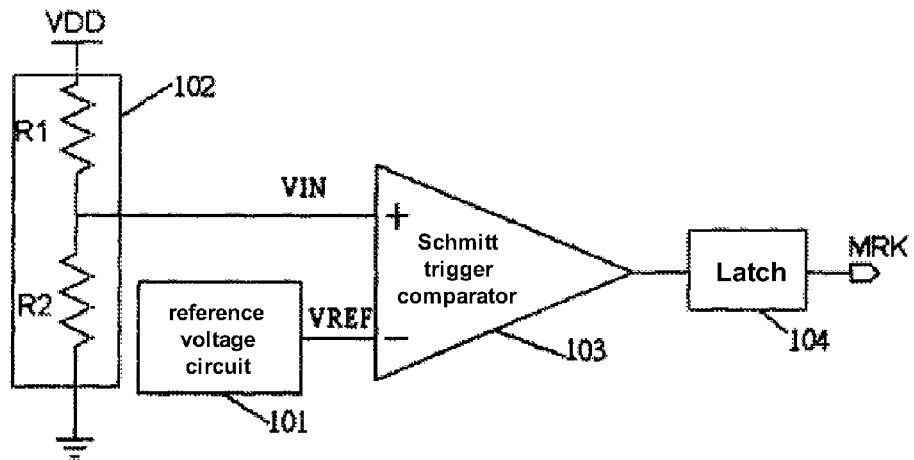
FIG. 1 is a schematic diagram of an example of a circuit for detecting multiple supply voltages.
Figure 2:
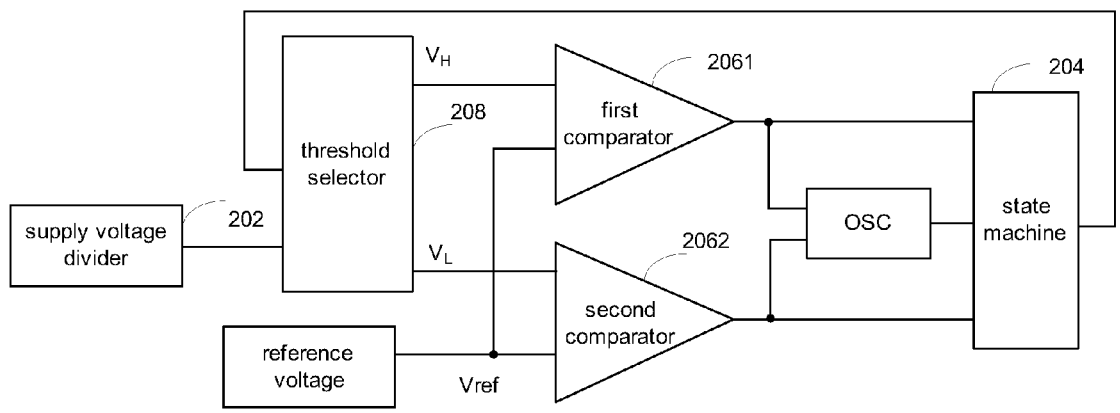
FIG. 2 is a schematic diagram of an example of a circuit for detecting multiple supply voltages.

The examples herein are described in detail with reference to the accompanying drawings and in combination with each other. It should be noted that the examples and the features of the examples described in the present application can be combined with each other as long as no conflict is introduced by such combination. According with an embodiment of the present invention, there is provided a circuit for detecting multiple supply voltages. FIG. 2 is a schematic diagram of an example of a circuit for detecting multiple supply voltages. As shown in FIG. 2, the detection circuit may comprise: a supply voltage divider 202, a state machine 204, two comparators 206 and a threshold selector 208, each of which is described below. The supply voltage divider 202, shown connected with the threshold selector 208, can be configured to divide a supply voltage $V_{CC}$ into N states $S_K$ and to acquire the border voltages $V_K$ and $V_{K+1}$ corresponding to the $S_K$ through a resistor divider, wherein K=1, 2, ... N.

The threshold selector 208, shown connected with the supply voltage divider 202 and the state machine 204, can be configured to acquire a corresponding voltage $V_K$ from the supply voltage divider 202 according to the current state $S_K$ output by the state machine 204, and then send the $V_K$, as $V_H$, to a first comparator 2061 of the two comparators 206, and to acquire a corresponding voltage $V_{K+1}$ and send the acquired $V_{K+1}$ as $V_L$, to a second comparator 2062 of the two comparators 206, wherein the $V_H$ is greater than the $V_L$.

The first comparator 2061 can be configured to compare a reference voltage $V_{ref}$ from a reference voltage circuit with the $V_H$; and the second comparator 2062 can be configured to compare the $V_{ref}$ with the $V_L$ in magnitude.

The state machine 204 can be configured to determine whether or not the $V_H$ and the $V_L$ output by the threshold selector 208 are matched with the current state $S_K$, when each clock period of an oscillator (OSC) arrives, according to the output results of the first comparator 2061 and the second comparator 2062. If the $V_H$ and the $V_L$ are matched with the current state $S_K$, the OSC of the state machine will be turned off, otherwise, the OSC will be turned on to provide the clock of the state machine 204 to output the next state $S_{k+1}$ or $S_{k-1}$ of the $S_K$.

By the above-described detection circuit example, the multiple supply voltages can be detected using two comparators 206, which solves the problem of huge power consumption of the existing circuit for detecting multiple supply voltages in the related art. The example also reduces the number of comparators and improves the performance of the system.

For instance, if a $V_{CC}$ is divided into $V_1, V_2, \ldots V_n$, then the $V_H$ and $V_L$ outputted by the threshold selector 208 may be as follows: $V_i = V_{CC} *$Ratio$_i$ (i=1, 2, ... n), wherein the Ratio$_i$ represents the ratio of a $V_{CC}$ resistor divider. In the implementation process, the supply voltage divider 202 may divide the supply voltage $V_{CC}$ into N states $S_k$ according to the reference voltage $V_{ref}$ of a reference voltage circuit.

Preferably, the first comparator 2061 can also be configured to output a high level when the $V_{ref}$ is greater than the $V_H$, or to output a low level when the $V_{ref}$ is smaller than the $V_H$, and the second comparator 2062 can also be configured to output a high level when the $V_L$ is greater than the $V_{ref}$ or to output a low level when the $V_L$ is smaller than the $V_{ref}$.

Preferably, the state machine 204 can also be configured to determine that the $V_H$ and the $V_L$ outputted by the threshold selector 208 are matched with the current state $S_K$ when the first comparator 2061 and the second comparator 2062 both output a low level.

It should be noted that the next edge of the OSC clock of the state machine 204 triggers the state change. In the implementation process, the period of the OSC can be longer than the delay-guaranteeing setup period of the comparators.

In some examples, the state machine 204 can also be configured to output the next state $S_{k+1}$ of the $S_K$ when the first comparator 2061 outputs a low level and the second comparator 2062 outputs a high level, or to output the next state $S_{k-1}$ of the $S_K$ when the first comparator 2061 outputs a high level and the second comparator 2062 outputs a low level.

In some examples, the first comparator 2061 can also be configured to output a high level when the $V_H$ is greater than the $V_{ref}$ or to output a low level when the $V_H$ is smaller than the $V_{ref}$, and the second comparator 2062 can also be configured to output a high level when the $V_L$ is greater than the $V_{ref}$ or to output a low level when the $V_L$ is smaller than the $V_{ref}$.

In some examples, the state machine 204 can also be configured to determine that the $V_H$ and the $V_L$ outputted by the threshold selector 208 are matched with the current state $S_K$ when the first comparator 2061 outputs a high level and the second comparator 2062 outputs a low level.

In some examples, the state machine 204 can also be configured to output the next state $S_{k+1}$ of the $S_K$ when the first comparator 2061 outputs a low level and the second comparator 2062 also outputs a low level, or to output the next state $S_{k-1}$ of the $S_K$ when the first comparator 2061 outputs a high level and the second comparator 2062 also outputs a high level.

In some examples, the threshold selector 208 can consist of a single-pole multi-throw switch. In the implementation process, each of $V_H$ terminal and $V_L$ terminal is connected with a single-pole multi-throw switch, wherein both of $V_H$ terminal and $V_L$ terminal are pole terminals. This method has simple implement and high operability.

Figure 3:
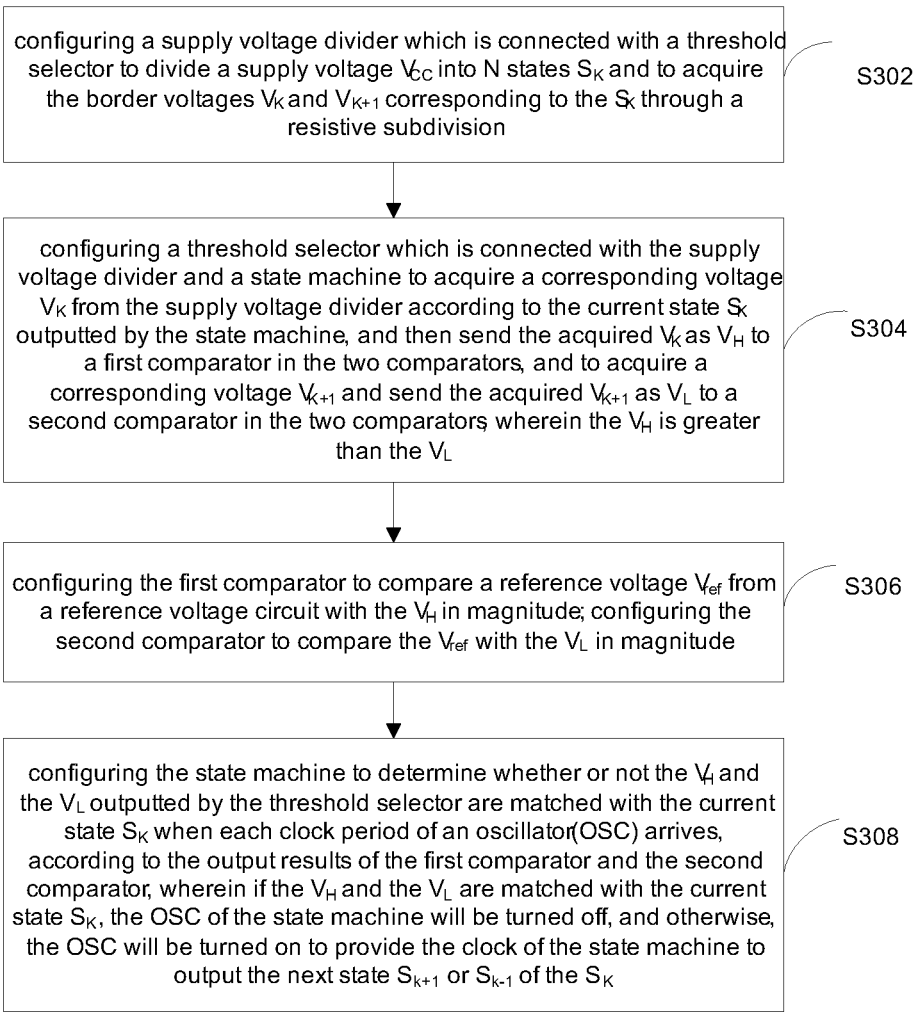
FIG. 3 is a flowchart of an example of a method for detecting multiple supply voltages.

A method for detecting multiple supply voltages can also be provided corresponding to the above-described detection circuit. FIG. 3 is a flowchart of an example of a method for detecting multiple supply voltages according to an embodiment of the present invention.

As shown in the example of FIG. 3, the method can include the following:

at S302, a supply voltage divider 202, which can be connected with the threshold selector 208, can be configured to divide a supply voltage $V_{CC}$ into N states $S_K$ and to acquire the border voltages $V_K$ and $V_{K+1}$ corresponding to a $S_K$ through a resistor divider, wherein K=1, 2, ... N;

at S304, a threshold selector 208, which can be connected with the supply voltage divider 202 and a state machine 204, can be configured to acquire a corresponding voltage $V_K$ from the supply voltage divider 202 according to the current state $S_K$ outputted by the state machine 204, and then send the $V_K$ as $V_H$ to a first comparator 2061 in the two comparators 206, and to acquire a corresponding voltage $V_{K+1}$ and send the acquired $V_{K+1}$ as $V_L$ to a second comparator 2062 in the two comparators 206, wherein the $V_H$ is greater than the $V_L$, at S306, a first comparator 2061 can be configured to compare a reference voltage $V_{ref}$ from a reference voltage circuit with the $V_H$ in magnitude, and configuring a second comparator to compare the $V_{ref}$ with the $V_L$ in magnitude; and at S308: a state machine 204 can be configured to determine whether or not the $V_H$ and the $V_L$ outputted by the threshold selector 208 are matched with the current state $S_K$, when each clock period of an oscillator (OSC) arrives, according to the output results of the first comparator 2061 and the second comparator 2062, wherein if the $V_H$ and the $V_L$ are matched with the current state $S_K$, the OSC of the state machine can be turned off, otherwise, the OSC can be turned on to provide the clock of the state machine 204 to output the next state $S_{k+1}$ or $S_{k-1}$ of the $S_K$.

By adopting the method in the above example, multiple supply voltages can be detected using two comparators 206, which solves the problem that power consumption of the existing circuit for detecting multiple supply voltages in the related art can be huge. Adopting the method can also reduce the number of comparators and improve the performance of the system.

In some examples, when the High input terminal of the first comparator 2061 and the Low input terminal of the second comparator 2062 are connected with the $V_{ref}$, S308 can include the state machine 204 determining that the $V_H$ and the $V_L$ output by the threshold selector 208 are matched with the current state $S_K$ if the first comparator 2061 and the second comparator 2062 both output a low level; and when the Low input terminal of the first comparator 2061 and the Low input terminal of the second comparator 2062 are both connected with the $V_{ref}$, S308 can include the state machine 204 determining that the $V_H$ and the $V_L$ output by the threshold selector 208 are matched with the current state $S_K$ if the first comparator 2061 outputs a high level and the second comparator 2062 outputs a low level.

Additional examples are described hereinafter.

According to some examples, a method for detecting multiple supply voltages can include using two comparators to reduce power consumption by reducing the number of comparators. Each comparator only consumes a current of 150 nA (150 nanoamps) and the method can detect all voltage ranges.

In certain examples, the circuit for detecting multiple supply voltages comprises: a $V_{CC}$ resistive divider, comparators, a threshold selector for the comparators, an oscillator (OSC), and a state machine.

Figure 4:
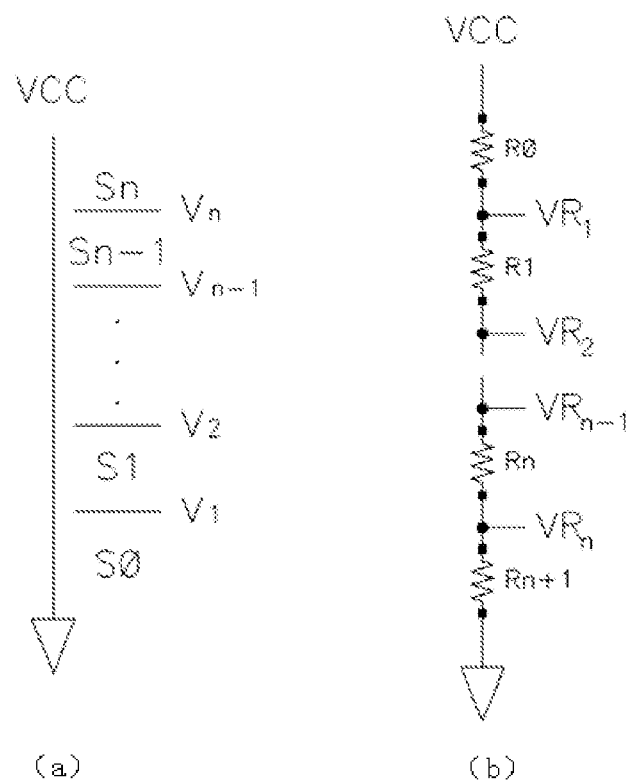
FIG. 4 is a schematic diagram of an example of division ranges of a supply voltage.

FIG. 4 is an example of a schematic diagram of the division ranges of a supply voltage. As shown in FIG. 4 (a), a $V_{CC}$ is divided into N ranges, such as range $S_1, S_2, \ldots S_n$. By using the comparative range borders $V_H$ and $V_L$ of two comparators (namely, the high and low thresholds of two comparators), it is detected whether or not the $V_{CC}$ is in a range between the $V_H$ and the $V_L$, wherein the oscillator (such as a low-frequency oscillator without power consumption when being disabled) will be turned on to provide the clock of the state machine if the $V_{CC}$ is not in the range.

Figure 5:
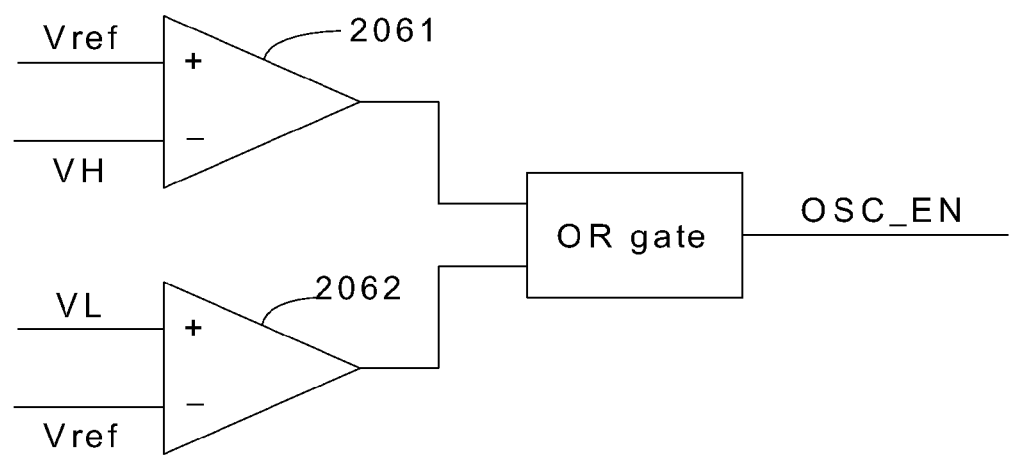
FIG. 5 is a schematic diagram of an example of a comparator.

FIG. 5 is an example of a schematic diagram of a comparator. As shown in FIG. 5, assuming the current state is $S_n$, if the comparator shows that the $V_{CC}$ is below the range $S_n$, then the next state is $S_{n+1}$; if the $V_{CC}$ is above the $S_n$, then the next state is $S_{n-1}$; and if the $V_{CC}$ is equal to the $S_n$, then the OSC is stopped. Particularly, the current state is maintained if the next state is beyond the range. The final stable state is between the $V_H$ and the $V_L$, which means that the outputs of the two comparators are fixed, and a smallest power-consuming state can be selected for the comparators to reduce power consumption.

In the above, the $V_H$ and the $V_L$ refer respectively to the high and low thresholds of the two comparators, and the $V_{ref}$ refers to the other input of the comparator. When the $V_{CC}$ rises or drops rapidly, the $V_{ref}$ is always kept between the $V_H$ and the $V_L$ by a state change. Any $V_{CC}$ has a final stable state in which the oscillator can be turned off In some examples, in order to determine that the next state will not be beyond the range, in the implementation process, a first range $S_0$ and a last range $S_{n+}$, may be added, wherein it is configured that the next state of the state $S_0$ can only be $S_0$ or $S_1$, and the next state of the state $S_{n+1}$, can only be $S_{n+}$, or $S_n$. In this way, the stability and the fault-tolerance of a system can be improved.

According to some examples, a method for detecting multiple supply voltages can include, as shown in FIG. 4 (a), dividing all the supply voltages to be identified into the ranges $S_0, S_1 \ldots S_n$ (namely, the state ranges of a state machine), wherein voltage $V_i$ is the border between range S and (i=1, 2, \ldots n).

The values of $R_0$ (namely, the ratio of a divider resistance) to $R_{n+}$, can be determined according to the border voltage V, and the reference voltage $V_{ref}$ output by a reference voltage circuit. As shown in FIG. 4 (b), when the $V_{CC}$ is finally equal to a $V_i$, a $VR_i$ equal to the $V_{ref}$ (i=1,2, \ldots n) can be achieved due to a resistor divider, and at the same time, for the sake of protecting this border state, it can be defined that '$VR_0=V_{CC}$' and '$VR_{n+1}=0$'. If the $V_{CC}$ is in a range $S_i$, namely, the $V_{CC}$ is between a $V_i$ and a $V_{i+1}$, then the $V_{ref}$ is between a $VR_i$ and a $VR_{i+1}$, by a resistor divider, and as a result, the problem how to determine the voltage range of $V_{CC}$ is converted to the comparison between the $VR_i$ and the $VR_{i+1}$, and the $V_{ref}$. So it can be seen that there is a significant difference from the existing detection circuit, in which each $VR_i$ is corresponding to one comparator, and a voltage range determined by a given logic realized according to the outputs of these comparators.

A threshold selector may select a $V_H$ and a $V_L$ for comparators according to the current state Sk. For example, $V_H=VR_k$, and $V_L=VR_{k+i}$. For instance, if the $V_{ref}$ is higher than the $V_H$ (namely, $VR_k$), then it is indicated that the range $S_j$ in which the $V_{CC}$ exists needs to meet 'j<K'. The state machine first allows 'j=k−1', and then continues to search for the correct voltage range of the $V_{CC}$.

Figure 6:
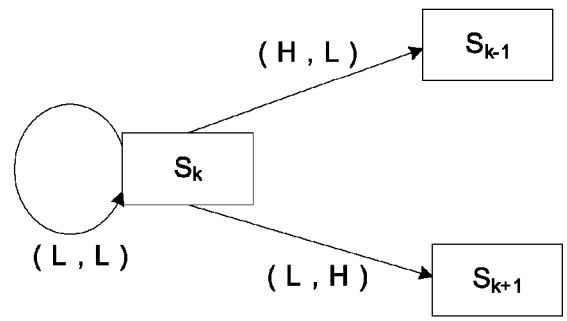
FIG. 6 is a flowchart of another example of a method for detecting multiple supply voltages.

FIG. 6 is an example of a schematic diagram of the state of a supply voltage according to a preferred embodiment of the present invention. As shown in FIG. 6, when the first comparator outputs a low level 'L' and the second comparator also outputs a low level 'L', the current state $S_k$ of the state machine is stable, and at the moment, the OSC clock of the state machine will be turned off; when the first comparator outputs a high level 'H' and the second comparator outputs a low level 'L', the state machine will output the next state $S_{k-1}$ of the current state $S_k$ when a clock edge arrives; and when the first comparator outputs a low level 'L' and the second comparator outputs a high level 'H', the state machine will output the next state $S_{k+1}$ of the current state $S_k$ when a clock edge arrives.

When OSC_EN in FIG. 5 is high, the outputs of the comparators are not (L, L), the OSC and the state machine will be started, and the state machine will determine the next state at each clock edge according to the current state of FIG. 6 and the outputs of the comparators. Since the final stable state is that the outputs of the comparators are (L, L), thus it can be designed that the comparators have the smallest power consumption when the output of the comparators are low levels.

Figure 7:
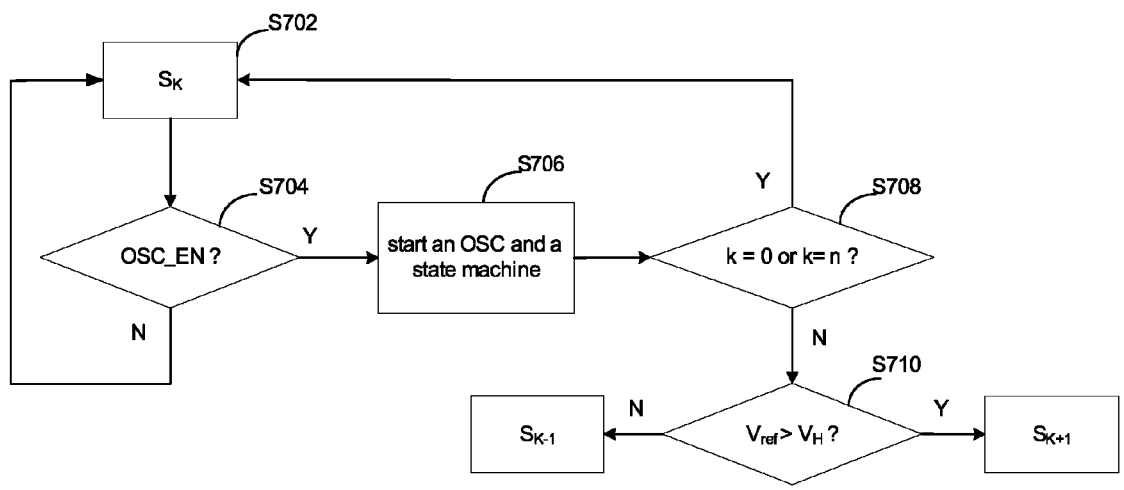
FIG. 7 is a schematic diagram of an example of a state machine.

FIG. 7 is a flowchart of an example of a method for detecting multiple supply voltages according to an embodiment of the present invention. As show in FIG. 7, the method comprises the following.

At S702, the current state is $S_k$.

At S704, it is determined whether or not the OSC_EN shown in FIG. 5 is at a high level according to the outputs of comparators, wherein if the OSC_EN is a high level, S706 is executed, and if the OSC_EN is at a low level, the current state is maintained.

At S706, an OSC and a state machine are started.

At S708, it is determined whether or not the state is in a border range, for example, k=0 or k=n, wherein if the state is in a border range, the current state is maintained, otherwise, S710 is executed.

At S710, it is determined whether or not the $V_{ref}$ is higher than a $V_H$, wherein if the $V_{ref}$ is higher than the $V_H$, a state $S_{k-1}$ is entered, otherwise, a state $S_{k+1}$ is entered.

The several examples described herein show that multiple supply voltages can be detected by using only two comparators, which reduces the number of comparators and lowers power consumption of the whole circuit system.

Additional Notes and Examples

Example 1 includes subject matter such as a circuit for detecting multiple supply voltages comprising a supply voltage divider, a state machine, two comparators and a threshold selector. The supply voltage divider, connected with the threshold divider, is configured to divide a supply voltage $V_{CC}$ into N states $S_K$, and to acquire the border voltages $V_K$ and $V_{K+1}$ corresponding to the $S_K$ through a resistor divider, wherein K=1, 2, ... N; the threshold selector, connected with the supply voltage divider and the state machine, is configured to acquire a corresponding voltage $V_K$ from the supply voltage divider according to the current state $S_K$ outputted by the state machine, and then send the acquired $V_K$ as $V_H$ to a first comparator in the two comparators, and to acquire a corresponding voltage $V_{K+1}$ and send the acquired $V_{K+1}$ as a $V_L$ to a second comparator in the two comparators, wherein the $V_H$ is greater than the $V_L$, the first comparator is configured to compare a reference voltage $V_{ref}$ from a reference voltage circuit with the $V_H$ in magnitude the second comparator is configured to compare the $V_{ref}$ with the $V_L$ in magnitude; and the state machine is configured to determine whether or not the $V_H$ and the $V_L$ outputted by the threshold selector are matched with the current state $S_K$, when each clock period of an oscillator (OSC) arrives, according to the output results of the first comparator and the second comparator, wherein if the $V_H$ and the $V_L$ are matched with the current state $S_K$, the OSC of the state machine will be turned off, and otherwise, the OSC will be turned on to provide the clock of the state machine to output the next state $S_{k+1}$ or $S_{k-1}$ of the $S_K$.

In Example 2, the subject matter of Example 1 can optionally include a first comparator optionally configured to output a high level when the $V_{ref}$ is greater than the $V_H$, or to output a low level when the $V_{ref}$ is smaller than the $V_H$, and the second comparator is further configured to output a high level when the $V_L$ is greater than the $V_{ref}$ or to output a low level when the $V_L$ is smaller than the $V_{ref}$.

In Example 3, the subject matter of one or any combination of Examples 1 and 2 can optionally include a state machine configured to determine that the $V_H$ and the $V_L$ outputted by the threshold selector are matched with the current state $S_K$ when the first comparator and the second comparator both output a low level.

In Example 4, the subject matter of one or any combination of Examples 1-3 can optionally include a state machine configured to output the next state $S_{k+1}$ of the $S_K$ when the first comparator outputs a low level and the second comparator outputs a high level, or to output the next state $S_{k-1}$ of the $S_K$ when the first comparator outputs a high level and the second comparator outputs a low level.

In Example 5, the subject matter of one or any combination of Examples 1-4 can optionally include a first comparator of the two comparators configured to output a high level when the $V_H$ is greater than the $V_{ref}$ or to output a low level when the $V_H$ is smaller than the $V_{ref}$, and the second comparator is further configured to output a high level when the $V_L$ is greater than the $V_{ref}$ or to output a low level when the $V_L$ is smaller than the $V_{ref}$.

In Example 6, the subject matter of one or any combination of Examples 1-5 can optionally include a state machine configured to determine that the $V_H$ and the $V_L$ outputted by the threshold selector are matched with the current state $S_K$ when the first comparator outputs a high level and the second comparator outputs a low level.

In Example 7, the subject matter of one or any combination of Examples 1-6 can optionally include a state machine configured to output the next state $S_{k+1}$ of the $S_K$ when the first comparator and the second comparator both output a low level, or to output the next state $S_{k-1}$ of the $S_K$ when the first comparator and the second comparator both output a high level.

In Example 8, the subject matter of one or any combination of Examples 1-7 can optionally include a threshold selector including a single-pole multi-throw switch.

Example 9 can include subject matter, or can optionally be combined with the subject matter of one or any combination of Examples 1-8 to include subject matter (such as a method, a means for performing acts, or a machine-readable medium including instructions that, when performed by the machine, cause the machine to perform acts) comprising configuring a supply voltage divider which is connected with a threshold selector to divide a supply voltage $V_{CC}$ into N states $S_K$ and to acquire the border voltages $V_K$ and $V_{K+1}$ corresponding to the $S_K$ through a resistor divider, wherein K=1, 2, ... N; configuring a threshold selector which is connected with the supply voltage divider and a state machine to acquire a corresponding voltage $V_K$ from the supply voltage divider according to the current state $S_K$ outputted by the state machine, and then send the $V_K$ as a $V_H$ to a first comparator in the two comparators, and to acquire a corresponding voltage $V_{K+1}$ and send the acquired $V_{K+1}$ as a $V_L$ to a second comparator in the two comparators, wherein the $V_H$ is greater than the $V_L$, configuring the first comparator to compare a reference voltage $V_{ref}$ from a reference voltage circuit with the $V_H$ in magnitude, configuring the second comparator to compare the $V_{ref}$ with the $V_L$ in magnitude; and configuring the state machine to determine whether or not the $V_H$ and the $V_L$ outputted by the threshold selector are matched with the current state $S_K$ when each clock period of an oscillator (OSC) arrives according to the output results of the first comparator and the second comparator, wherein if the $V_H$ and the $V_L$ are matched with the current state $S_K$, the OSC of the state machine will be turned off, and otherwise, the OSC will be turned on to provide the clock of the state machine to output the next state $S_{k+1}$ or $S_{k-1}$ of the $S_k$.

In Example 10, when the High input terminal of the first comparator and the Low input terminal of the second comparator are both connected with the $V_{ref}$, the step of configuring the state machine of Example 9 can optionally include: the state machine determining that the $V_H$ and the $V_L$ outputted by the threshold selector are matched with the current state $S_K$ when the first comparator and the second comparator both output a low level; and when the Low input terminal of the first comparator and the Low input terminal of the second comparator are both connected with the $V_{ref}$, the step of configuring the state machine can optionally include: the state machine determining that the $V_H$ and the $V_L$ outputted by the threshold selector are matched with the current state $S_K$ when the first comparator outputs a high level and the second comparator outputs a low level.

Example 11 can include, or can optionally be combined with any portion or combination of any portions of any one or more of Examples 1-20 to include, subject matter that can include means for performing any one or more of the functions of Examples 1-10, or a machine-readable medium including instructions that, when performed by a machine, cause the machine to perform any one or more of the functions of Examples 1-10.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." In the event of inconsistent usages between this document and documents incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like. In some examples, a carrier medium can carry code implementing the methods. The term "carrier medium" can be used to represent carrier waves on which code is transmitted.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A circuit comprising: a supply voltage divider, a state machine, two comparators and a threshold selector, wherein
the supply voltage divider, connected with the threshold selector, is configured to divide a supply voltage $V_{CC}$ into N states $S_K$, and to acquire the border voltages $V_K$ and $V_{K+1}$ corresponding to the $S_K$ through a resistor divider, wherein K=1, 2, ... N;
the threshold selector, connected with the supply voltage divider and the state machine, is configured to acquire a corresponding voltage $V_K$ from the supply voltage divider according to the current state $S_K$ outputted by the state machine, send the acquired $V_K$ as $V_H$ to a first comparator in the two comparators, and to acquire a corresponding voltage $V_{K+1}$ and send the acquired $V_{K+1}$ as $V_L$ to a second comparator in the two comparators, wherein the $V_H$ is greater than the $V_L$;
the first comparator is configured to compare a reference voltage $V_{ref}$ from a reference voltage circuit with the $V_H$ in magnitude; the second comparator is configured to compare the $V_{ref}$ with the $V_L$ in magnitude; and
the state machine is configured to determine whether or not the $V_H$ and the $V_L$ outputted by the threshold selector are matched with the current state $S_K$, when each clock period of an oscillator (OSC) arrives, according to the output results of the first comparator and the second comparator, wherein if the $V_H$ and the $V_L$ are matched with the current state $S_K$, the OSC of the state machine will be turned off, and otherwise, the OSC will be turned on to provide the clock of the state machine to output the next state $S_{k+1}$ or $S_{k-1}$ of the $S_K$.

2. The circuit of claim 1, wherein the first comparator is further configured to output a high level when the $V_{ref}$ is greater than the $V_H$, or to output a low level when the $V_{ref}$ is smaller than the $V_H$, and the second comparator is further configured to output a high level when the $V_L$ is greater than the $V_{ref}$, or to output a low level when the $V_L$ is smaller than the $V_{ref}$.

3. The circuit of claim 2, wherein the state machine is further configured to determine that the $V_H$ and the $V_L$ outputted by the threshold selector are matched with the current state $S_K$ when the first comparator and the second comparator both output a low level.

4. The circuit of claim 3, wherein the threshold selector consists of a single-pole multi-throw switch.

5. The circuit of claim 2, wherein the state machine is further configured to output the next state $S_{k+1}$ of the $S_K$ when the first comparator outputs a low level and the second comparator outputs a high level, or to output the next state $S_{k-1}$ of the $S_K$ when the first comparator outputs a high level and the second comparator outputs a low level.

6. The circuit of claim 5, wherein the threshold selector consists of a single-pole multi-throw switch.

7. The circuit of claim 2, wherein the threshold selector consists of a single-pole multi-throw switch.

8. The circuit of claim 1, wherein the first comparator is further configured to output a high level when the $V_H$ is greater than the $V_{ref}$ or to output a low level when $V_H$ is smaller than the $V_{ref}$, and the second comparator is further configured to output a high level when the $V_L$ is greater than the $V_{ref}$ or to output a low level when the $V_L$ is smaller than the $V_{ref}$.

9. The circuit of claim 8, wherein the state machine is further configured to determine that the $V_H$ and the $V_L$ outputted by the threshold selector are matched with the current state $S_K$ when the first comparator outputs a high level and the second comparator output a low level.

10. The circuit of claim 9, wherein the threshold selector consists of a single-pole multi-throw switch.

11. The circuit of claim 8, wherein the state machine is further configured to output the next state $S_{k+1}$ of the $S_K$ when the first comparator and the second comparator both output a low level, or to output the next state $S_{k-1}$ of the $S_K$ when the first comparator and the second comparator both output a high level.

12. The circuit of claim 11, wherein the threshold selector consists of a single-pole multi-throw switch.

13. The circuit of claim 8, wherein the threshold selector consists of a single-pole multi-throw switch.

14. The circuit of claim 1, wherein the threshold selector consists of a single-pole multi-throw switch.

15. A method comprising:
configuring a supply voltage divider which is connected with a threshold selector to divide a supply voltage $V_{CC}$ into N states $S_K$ and to acquire the border voltages $V_K$ and $V_{K+1}$ corresponding to the $S_K$ through a resistor divider, wherein K=1, 2, . . . N;
configuring the threshold selector which is connected with the supply voltage divider and a state machine to acquire a corresponding voltage $V_K$ from the supply voltage divider according to the current state $S_K$ outputted by the state machine, send the acquired $V_K$ as $V_H$ to a first comparator in the two comparators, and to acquire a corresponding voltage $V_{K+1}$ and send the acquired $V_{K+1}$ as $V_L$ to a second comparator in the two comparators, wherein the $V_H$ is greater than the $V_L$;
configuring the first comparator to compare a reference voltage $V_{ref}$ from a reference voltage circuit with the $V_H$ in magnitude; configuring the second comparator to compare the $V_{ref}$ with the $V_L$ in magnitude; and
configuring the state machine to determine whether or not the $V_H$ and the $V_L$ outputted by the threshold selector are matched with the current state $S_K$ when each clock period of an oscillator (OSC) arrives, according to the output results of the first comparator and the second comparator, wherein if the $V_H$ and the $V_L$ are matched with the current state $S_K$, the OSC of the state machine will be turned off, and otherwise, the OSC will be turned on to provide the clock of the state machine to output the next state $S_{k+1}$ or $S_{k-1}$ of the $S_K$.

16. The method of claim 15, wherein
when the High input terminal of the first comparator and the Low input terminal of the second comparator are both connected with the $V_{ref}$, the step of configuring the state machine comprises: the state machine determining that the $V_H$ and the $V_L$ outputted by the threshold selector are matched with the current state $S_K$ when the first comparator and the second comparator both output a low level; and
when the Low input terminal of the first comparator and the Low input terminal of the second comparator are both connected with the $V_{ref}$, the step of configuring the state machine comprises: the state machine determining that the $V_H$ and the $V_L$ outputted by the threshold selector are matched with the current state $S_K$ when the first comparator outputs a high level and the second comparator outputs a low level.

* * * * *